(12) United States Patent
Cha et al.

(10) Patent No.: US 10,706,938 B2
(45) Date of Patent: Jul. 7, 2020

(54) STORAGE DEVICE AND OPERATING METHOD FOR APPLYING A PROGRAM VOLTAGE TO ERASED WORD LINE TO CLOSE OPEN MEMORY BLOCK

(71) Applicant: SAMSUNG ELECTRONICS CO., LTD., Suwon-si, Gyeonggi-do (KR)

(72) Inventors: Sang-Soo Cha, Suwon-si (KR); Young-Seop Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/844,197

(22) Filed: Dec. 15, 2017

(65) Prior Publication Data
US 2018/0358098 A1  Dec. 13, 2018

(30) Foreign Application Priority Data

Jun. 7, 2017  (KR) .................. 10-2017-0070862

(51) Int. Cl.
| | | |
|---|---|---|
| *G11C 16/16* | (2006.01) | |
| *G11C 16/34* | (2006.01) | |
| *G06F 12/02* | (2006.01) | |
| *G11C 5/14* | (2006.01) | |
| *G11C 16/08* | (2006.01) | |

(Continued)

(52) U.S. Cl.
CPC .......... *G11C 16/16* (2013.01); *G06F 12/0246* (2013.01); *G11C 5/144* (2013.01); *G11C 5/148* (2013.01); *G11C 11/5628* (2013.01); *G11C 16/0483* (2013.01); *G11C 16/08* (2013.01); *G11C 16/10* (2013.01); *G11C 16/20* (2013.01); *G11C 16/3459* (2013.01); *G11C 16/3495* (2013.01); *G06F 2212/1036* (2013.01);
(Continued)

(58) Field of Classification Search
CPC ..... G11C 16/16; G11C 16/08; G11C 16/3495; G11C 5/144; G11C 7/20; G11C 16/0483; G11C 16/10; G11C 16/20; G11C 16/3459; G11C 5/148; G11C 11/5628; G06F 12/08; G06F 12/0246
USPC ....................................................... 365/185.29
See application file for complete search history.

(56) References Cited

U.S. PATENT DOCUMENTS 7,679,133 B2   3/2010  Son et al.
8,553,466 B2  10/2013  Han et al.
(Continued)

FOREIGN PATENT DOCUMENTS

JP              593512 B2    8/2016

*Primary Examiner* — Sung Il Cho
(74) *Attorney, Agent, or Firm* — Volentine, Whitt & Francos, PLLC

(57) ABSTRACT

An operating method of a storage device, which includes a nonvolatile memory device, includes entering a power-on mode, searching for an open memory block, which includes at least one erase word line, from among memory blocks included in the nonvolatile memory device, applying a program voltage to the at least one erase word line to close the open memory block if the number of the erase word lines included in the open memory block is not more than a preset value, and after the power-on mode, entering a normal operation mode. Memory cells connected to the at least one erase word line to which the program voltage is applied are programmed to have a threshold voltage distribution range higher than a threshold voltage distribution range of an erase state.

18 Claims, 16 Drawing Sheets

(51) Int. Cl.
*G11C 16/20* (2006.01)
*G11C 16/10* (2006.01)
*G11C 11/56* (2006.01)
*G11C 16/04* (2006.01)
*G11C 7/20* (2006.01)

(52) U.S. Cl.
CPC ........... *G06F 2212/7201* (2013.01); *G06F 2212/7206* (2013.01); *G11C 7/20* (2013.01)

(56) References Cited

U.S. PATENT DOCUMENTS

| | | | |
|---|---|---|---|
| 8,559,235 B2 | 10/2013 | Yoon et al. | |
| 8,654,587 B2 | 2/2014 | Yoon et al. | |
| 9,201,789 B1 | 12/2015 | Kang et al. | |
| 9,229,806 B2 | 1/2016 | Mekhanik et al. | |
| 9,378,137 B2 | 6/2016 | Kim et al. | |
| 9,418,746 B2 | 8/2016 | Moon et al. | |
| 9,449,695 B2 | 9/2016 | Kim et al. | |
| 9,460,799 B1 | 10/2016 | Costa et al. | |
| 9,530,517 B2 | 12/2016 | Lee et al. | |
| 2008/0253181 A1* | 10/2008 | Edahiro | G11C 16/3418 365/185.03 |
| 2011/0233648 A1 | 9/2011 | Seol et al. | |
| 2013/0097365 A1* | 4/2013 | Lee | G06F 12/0246 711/103 |
| 2014/0019675 A1* | 1/2014 | Oh | G06F 12/0246 711/103 |
| 2014/0289559 A1* | 9/2014 | Hashimoto | G11C 29/08 714/27 |
| 2015/0186055 A1* | 7/2015 | Darragh | G06F 3/0616 711/103 |
| 2016/0133329 A1* | 5/2016 | Moon | G11C 16/14 365/185.11 |
| 2016/0343449 A1* | 11/2016 | Lee | G11C 11/5635 |
| 2017/0031615 A1 | 2/2017 | Lee | |
| 2017/0116075 A1* | 4/2017 | Yang | G06F 11/1068 |
| 2018/0059971 A1* | 3/2018 | Jung | G11C 11/5635 |
| 2018/0301193 A1* | 10/2018 | Srinivasan | G11C 16/12 |

* cited by examiner

FIG. 5
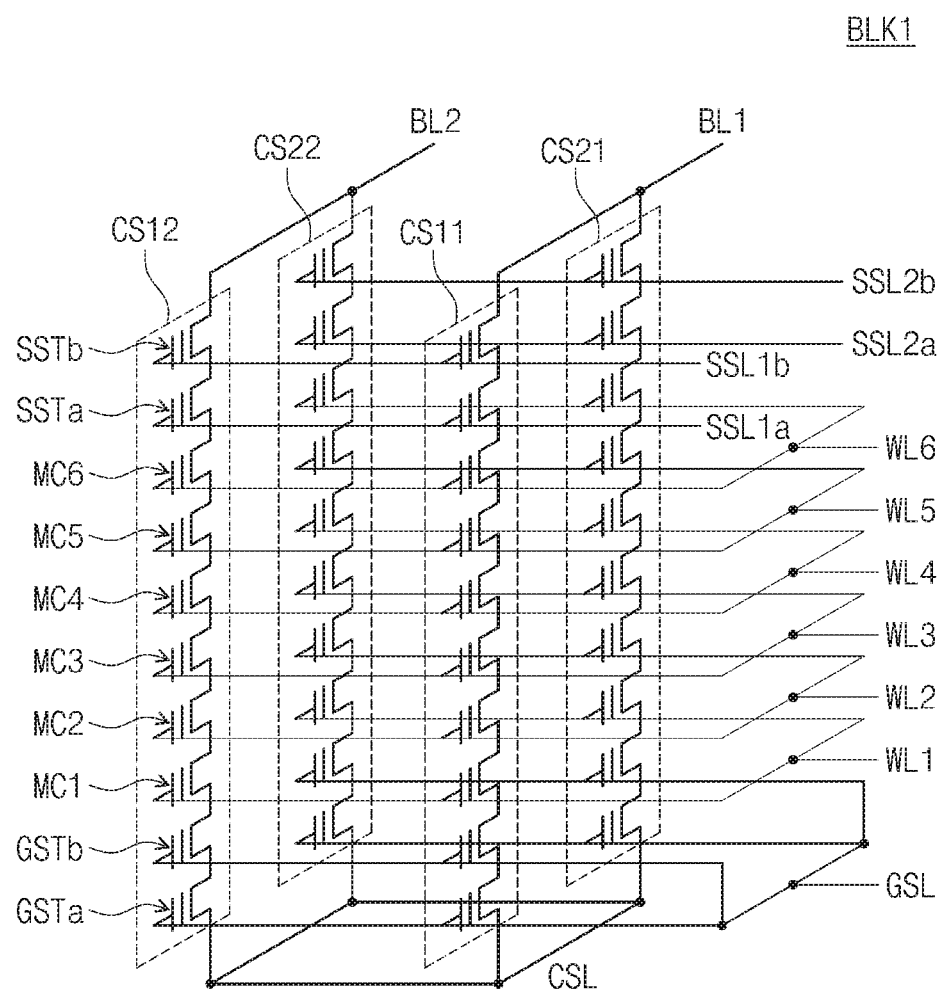
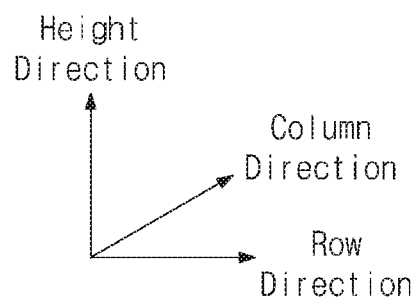

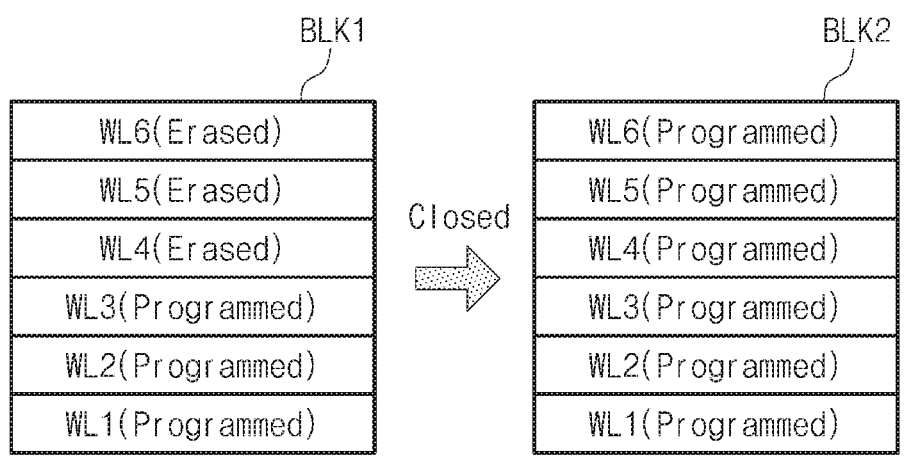

STORAGE DEVICE AND OPERATING METHOD FOR APPLYING A PROGRAM VOLTAGE TO ERASED WORD LINE TO CLOSE OPEN MEMORY BLOCK

CROSS-REFERENCE TO RELATED APPLICATIONS

A claim for priority under 35 U.S.C. § 119 is made to Korean Patent Application No. 10-2017-0070862 filed Jun. 7, 2017, in the Korean Intellectual Property Office, the entire contents of which are hereby incorporated by reference.

BACKGROUND

Embodiments of the disclosure disclosed herein relate to a semiconductor memory, and more particularly, to a storage device and an operating method thereof.

A storage device refers to a device storing data under control of a host device, such as a computer, a smartphone, and a smart pad. The storage device includes a device storing data in a semiconductor memory, in particular, a nonvolatile memory.

Semiconductor memory devices are classified into volatile memory devices, which lose data stored therein at power-off, such as a static random access memory (SRAM), a dynamic RAM (DRAM), and a synchronous DRAM, and nonvolatile memory devices, which retain data stored therein even at power-off, such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

As semiconductor manufacturing technologies have been developed, there is a continuous increase in the degree of integration and capacity of the storage device. The high degree of integration of the storage device makes it possible to reduce costs needed to manufacture the storage device. However, if the storage device is scaled down due to the high degree of integration thereof, various new issues occur. Since such issues cause a damage of data stored in the storage device, the reliability of the storage device may decrease.

SUMMARY

Embodiments of the disclosure provide a storage device with improved reliability and an operating method thereof.

According to an embodiment, an operating method of a storage device, which has a nonvolatile memory device, includes: (a) entering a power-on mode, (b) searching for an open memory block, which includes at least one erase word line, from among memory blocks included in the nonvolatile memory device, (c) applying a program voltage to the at least one erase word line to close the open memory block if the number of the erase word lines included in the open memory block is not more than a preset value, and (d) after the power-on mode, entering a normal operation mode. Memory cells connected to the at least one erase word line to which the program voltage is applied are programmed to have a threshold voltage distribution range higher than a threshold voltage distribution range of an erase state.

According to another embodiment, a storage device includes a nonvolatile memory device and a memory controller transmitting a program command to the nonvolatile memory device. The memory controller transmits the program command to the nonvolatile memory, which has an open memory block in which at least one erase word line is included, in a power-on mode. The nonvolatile memory device closes the open memory block by programming the at least one erase word line included in the open memory block in response to the program command.

According to another embodiment, an operating method of a storage device includes: (a) entering a power-off mode, (b) searching for an open memory block, which includes at least one erase word line, from among memory blocks included in a nonvolatile memory device, (c) programming the at least one erase word line included in the open memory block to close the open memory block if the number of the erase word line included in the open memory block is not more than a preset first value in the power-off mode, and (d) interrupting power of the storage device.

According to another embodiment, an operating method executed by a storage device, which has a nonvolatile memory device, includes: a) identifying a number of word lines in a memory block of the nonvolatile memory device that address only memory cells existing in an erase state, and b) applying, in response to determining that the number is less than a predetermined value, a programming voltage to each of the memory cells addressed by the word lines.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 5 is a circuit diagram illustrating a memory block according to an embodiment of the disclosure;

FIG. 7 describes an open memory block among memory blocks of the nonvolatile memory device according to an embodiment of the disclosure;

FIG. 8 illustrates an example of closing an open memory block of FIG. 7;

DETAILED DESCRIPTION

Below, embodiments of the disclosure may be described in detail and clearly to such an extent that an ordinary one in the art easily implements the disclosure.

Figure 1:
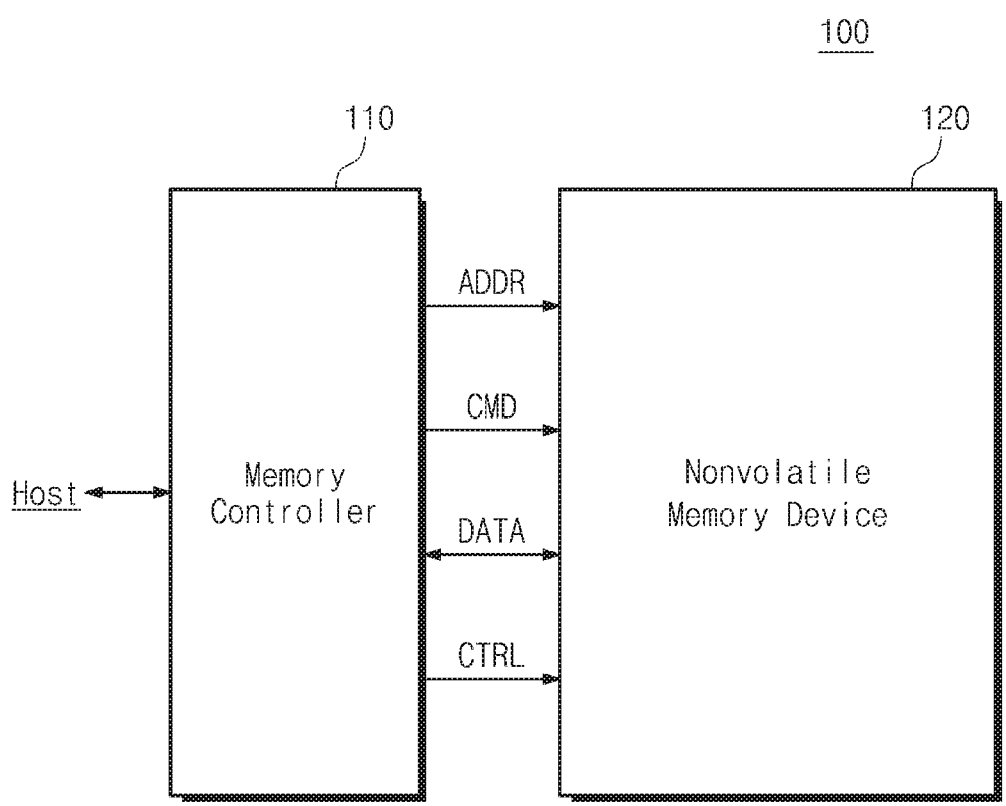
FIG. 1 is a block diagram illustrating a storage device according to an embodiment of the disclosure.

FIG. 1 is a block diagram illustrating a storage device according to an embodiment of the disclosure. Referring to FIG. 1, a storage device 100 includes a memory controller 110 and a nonvolatile memory device 120. In an embodiment, the storage device 100 may be a mass storage medium such as a solid state drive (SSD), a universal serial bus (USB) memory, a hard disk drive, or a USB stick.

The memory controller 110 may exchange data in response to a request from a host, HOST. The memory controller 110 may read data from the nonvolatile memory device 120 in response to a request from the host and may provide the read data to the host. Also, the memory controller 110 may program data received from the host in the nonvolatile memory device 120 in response to a request from the host.

To perform the above-described operations, the memory controller 110 may provide an address ADDR, a command CMD, and a control signal CTRL to the nonvolatile memory device 120 and may exchange data, DATA, with the nonvolatile memory device 120.

The nonvolatile memory device 120 may output data or may program received data in response to signals received from the memory controller 110. In an embodiment, the nonvolatile memory device 120 may include a NAND flash memory. However, embodiments may not be limited thereto. For example, the nonvolatile memory device 120 may include a volatile memory, such as a static random access memory (SRAM), a DRAM, or a synchronous DRAM (SDRAM), or a nonvolatile memory, such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), or a ferroelectric RAM (FRAM).

The memory controller 110 may provide the nonvolatile memory device 120 with a read command, a program command, an erase command, or a dummy program command as the command CMD. The memory controller 110 may request a program operation of a word line unit of the nonvolatile memory device 120 through the program command. The memory controller 110 may request a read operation of the word line unit of the nonvolatile memory device 120 through the read command. The memory controller 110 may request an erase operation of the memory block or sub block unit of the nonvolatile memory device 120 through the erase command. The memory controller 110 may close an open memory block among memory blocks of the nonvolatile memory device 120 through the dummy program command. The dummy program command may be included in the program command. In an embodiment, the memory controller 110 may sense power-on or power-off the storage device 100 to close an open memory block.

The open memory block may refer to a memory block including a word line (hereinafter referred to as a "program word line") connected with programmed memory cells and a word line (hereinafter referred to as an "erase word line") connected with memory cells of an erase state. In an embodiment, the open memory block may include a memory cell of a program state and a memory cell of an erase state. The memory cell of the program state may be included in the program word line, and the memory cell of the erase state may be included in the erase word line. That the memory controller 110 programs a word line through the program command may mean programming one or more memory cells connected to the word line. The memory controller 110 may close an open memory block by programming all erase word lines of the open memory block through the dummy program command. Accordingly, since all memory cells connected with word lines of the open memory block have a program state, the open memory block may switch into a closed memory block.

In an embodiment, the closed memory block may refer to a memory block including only word lines connected with programmed memory cells. Each memory cell of the closed memory block may store specific data corresponding to a program state. Each memory cell of the closed memory block may not store specific data corresponding to a program state.

A dummy program operation may be performed to change a threshold voltage distribution of memory cells. For example, a dummy-programmed memory cell is programmed by using a program voltage value stored in advance in the storage device 100 or the nonvolatile memory device 120, and thus, a threshold voltage distribution may change. A dummy program operation may refer to an operation of applying a program voltage for changing a threshold voltage distribution of memory cells, and specific data may be stored or may not be stored in a memory cell through the dummy program operation. Accordingly, the dummy program operation may be performed by a normal program operation performed by the program command. Below, the dummy program command and the dummy program operation associated with the dummy program command will be more fully described with reference to accompanying drawings.

Figure 2:
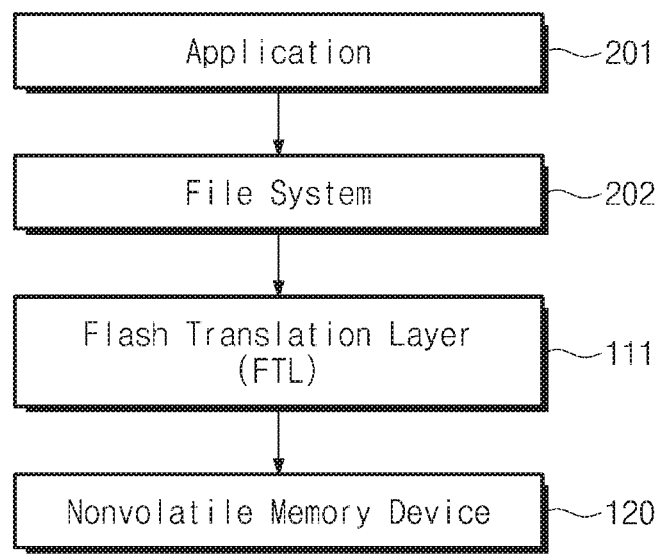
FIG. 2 is a block diagram illustrating software layers including a software operation of the storage device of FIG. 1.

FIG. 2 is a block diagram illustrating software layers including a software operation of a storage device of FIG. 1. Referring to FIGS. 1 and 2, software layers of a user device (not illustrated) including a host and the storage device 100 may include an application 201, a file system 202, and a flash translation layer (FTL) 111.

The application 201 may include various application programs driven on the user device or the host. The file system 202 may organize files or data used by the application 201. For example, the file system 202 may manage a storage space of the storage device 100 with logical addresses and may assign a logical address to data stored or to be stored in the storage device 100 for management. In an embodiment, the file system 202 may have a type that is variable depending on an operating system OS of the user device or the host. In an embodiment, the file system 202 may include FAT (File Allocation Table), FAT32, NTFS (NT File System), HFS (Hierarchical File System), JSF2 (Journaled File System2), XFS, ODS-5 (On-Disk Structure-5), UDF, ZFS, UFS (Unix File System), ext2, ext3, ext4, ReiserFS, Reiser4, ISO 9660, Gnome VFS, BFS, WinFS, etc. The application 201 and the file system 202 may be software layers driven in the host.

The FTL 111 may perform various maintenance operations between the host and the nonvolatile memory device 120 such that the nonvolatile memory device 120 is used efficiently. For example, the FTL 111 may perform a translation operation between a logical address and a physical address. The logical address is information managed by the file system 202, and the physical address is information representing a physical location of the nonvolatile memory device 120, at which data are stored. The FTL 111 may manage the address translation operation through a mapping table (not illustrated).

In an embodiment, the FTL 111 may find an open memory block among memory blocks of the nonvolatile memory device 120 by using a physical address at which data are stored or the mapping table. The FTL 111 may search for program word lines among word lines of the nonvolatile memory device 120 by using a physical address or the mapping table and may find an open memory block based on the found result. The storage device 100 may perform the dummy program operation on the open memory block found through the FTL 111, thus closing the open memory block.

In an embodiment, the FTL 111 may search for an open memory block depending on an operation state of the storage device 100 and may close the found open memory block by performing the dummy program operation on the found open memory block. For example, the FTL 111 may search for an open memory block when the storage device 100 is in a power-on state and may close the found open memory block by performing the dummy program operation on the found open memory block. Also, the FTL 111 may search for an open memory block when the storage device 100 is in a power-off state and may close the found open memory block by performing the dummy program operation on the found open memory block.

Figure 3:
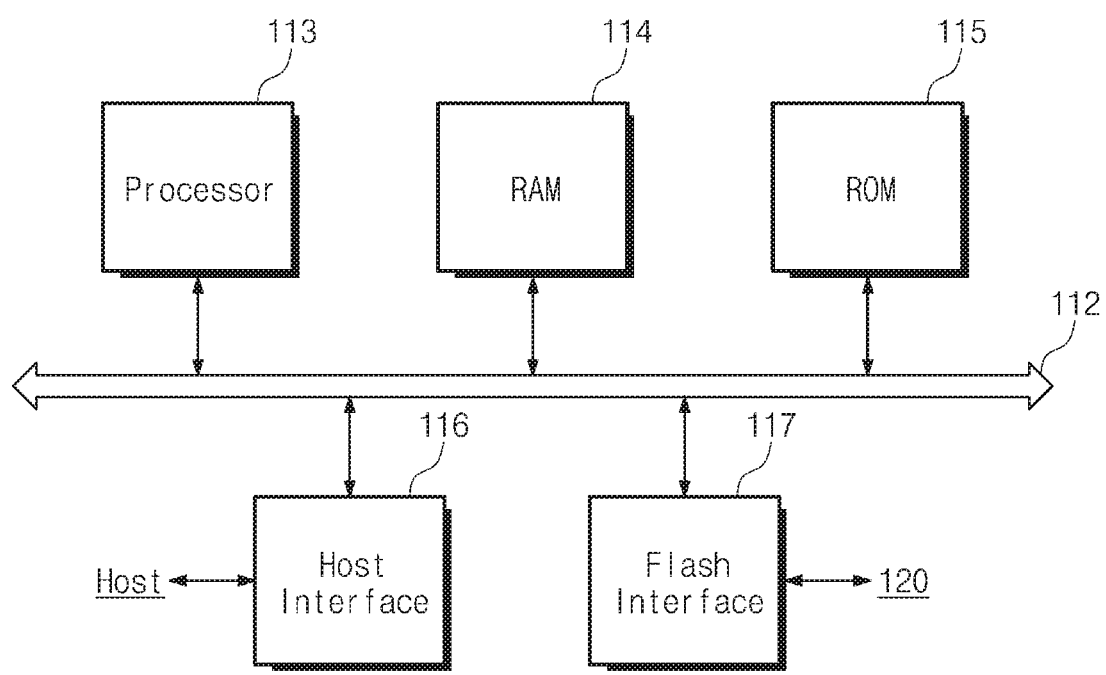
FIG. 3 is a block diagram illustrating a memory controller of FIG. 1.

FIG. 3 is a block diagram illustrating a memory controller of FIG. 1. For a brief description, only some elements of the memory controller 110 are illustrated in FIG. 3. However, embodiments may not be limited thereto. For example, the memory controller 110 may further include other elements such as an error correction code (ECC) circuit.

Referring to FIGS. 1 and 3, the memory controller 110 includes a bus 112, a processor 113, a random access memory (RAM) 114, a read only memory (ROM) 115, a host interface 116, and a flash interface 117.

The bus 112 is configured to provide a channel between elements of the memory controller 110. The processor 113 may perform overall operations of the memory controller 110. The RAM 114 may be used as a buffer memory, a cache memory, or a working memory of the memory controller 110. The RAM 114 may store codes and commands that the processor 113 will execute. The RAM 114 may store data processed by the processor 113. The RAM 114 may include a static RAM (SRAM).

The ROM 115 may store a variety of information needed for the memory controller 110 to operate in the form of firmware. In an embodiment, the FTL 111 of FIG. 2 may be implemented in the form of software and may be stored in the ROM 115 or the RAM 114. The FTL 111 stored in the ROM 115 or the RAM 114 may be driven by the processor 113.

The memory controller 110 may communicate with the host through the host interface 116. The memory controller 110 may communicate with the nonvolatile memory device 120 through the flash interface 117. In an embodiment, the memory controller 110 may transmit the dummy program command to the nonvolatile memory device 120 through the flash interface 117.

Figure 4:
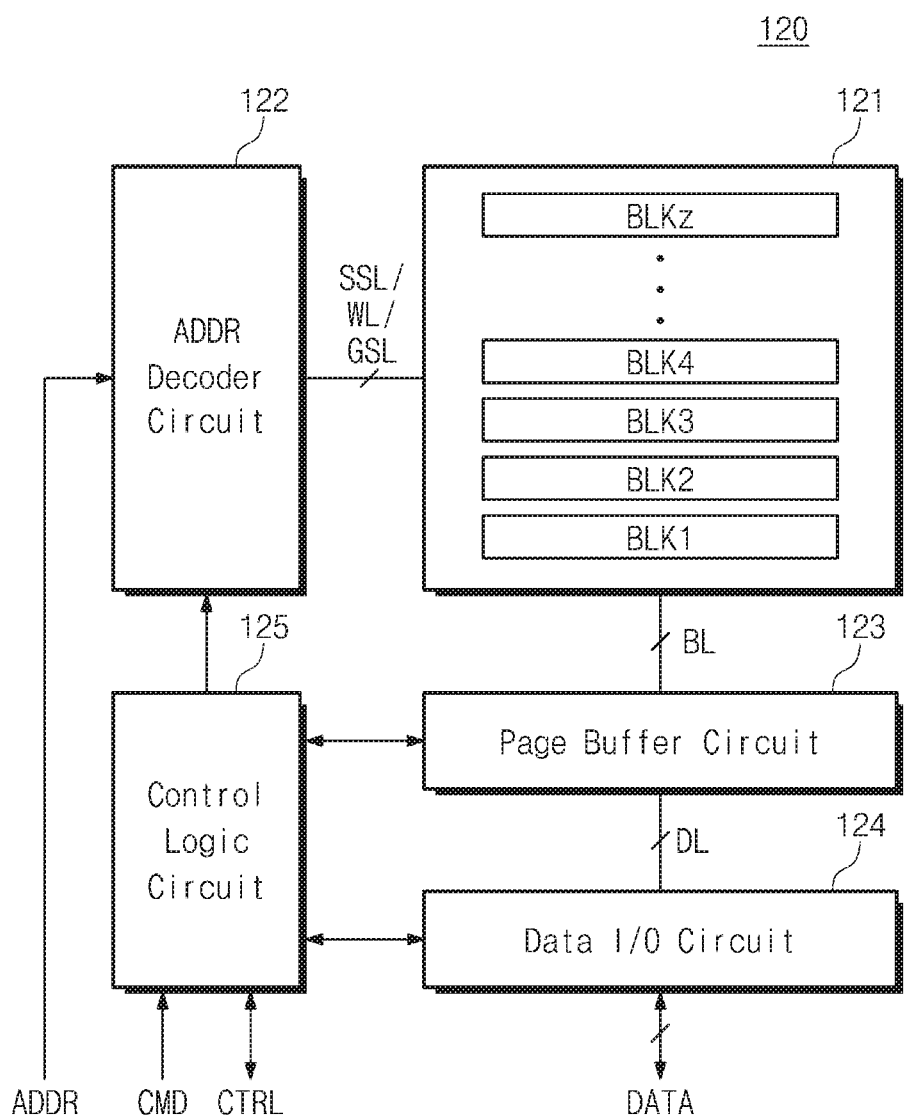
FIG. 4 is a block diagram illustrating a nonvolatile memory device of FIG. 1.

FIG. 4 is a block diagram illustrating a nonvolatile memory device of FIG. 1. Referring to FIG. 4, the nonvolatile memory device 120 includes a memory cell array 121, an address decoder circuit 122, a page buffer circuit 123, a data input/output circuit 124, and a control logic circuit 125.

The memory cell array 121 includes a plurality of memory blocks BLK1 to BLKz. Each of the memory blocks BLK1 to BLKz includes a plurality of memory cells. Each of the memory blocks BLK1 to BLKz may be connected to the address decoder circuit 122 through at least one ground selection line GSL, a plurality of word lines WL, and at least one string selection line SSL. Each of the memory blocks BLK1 to BLKz may be connected to the page buffer circuit 123 through a plurality of bit lines BL. The memory blocks BLK1 to BLKz may be connected to the bit lines BL. The memory cells of the memory blocks BLK1 to BLKz may have the same structure. In an embodiment, each of the memory blocks BLK1 to BLKz may correspond to a unit of an erase operation. The memory cells of the memory cell array 121 may be erased in units of a memory block. The memory cells belonging to a memory block may be erased at the same time. For another example, each of the memory blocks BLK1 to BLKz may be divided into a plurality of sub-blocks. Each sub-block may correspond to a unit of an erase operation.

The address decoder circuit 122 may be connected to the memory cell array 121 through a plurality of ground selection lines GSL, the plurality of word lines WL, and a plurality of string selection lines SSL. The address decoder circuit 122 operates under control of the control logic circuit 125. The address decoder circuit 122 may receive an address ADDR from the memory controller 110. The address decoder circuit 122 may decode the received address ADDR and may control voltages to be applied to the word lines WL based on the decoded address.

For example, during a program operation, the address decoder circuit 122 may apply a program voltage Vpgm to a selected word line of a selected memory block corresponding to the address ADDR and may apply a pass voltage Vpass to unselected word lines of the selected memory block. The address decoder circuit 122 may apply a verification voltage Vvfy to the selected word line. During a dummy program operation, the address decoder circuit 122 may apply the program voltage Vpgm to the selected word line of the selected memory block that the address ADDR indicates. During a read operation, the address decoder circuit 122 may apply a selection read voltage Vrd to the selected word line of the selected memory block that the address ADDR indicates and may apply a non-selection read voltage Vread to unselected word lines of the selected memory block, respectively. During an erase operation, the address decoder circuit 122 may apply an erase voltage (e.g., a ground voltage) to word lines of the selected memory block that the address ADDR indicates.

The page buffer circuit 123 is connected to the memory cell array 121 through the bit lines BL. The page buffer circuit 123 is connected to the data input/output circuit 124 through a plurality of data lines DL. The page buffer circuit 123 operates under control of the control logic circuit 125.

The page buffer circuit 123 may store data to be programmed in memory cells of the memory cell array 121 or data read from the memory cells. During the program operation, the page buffer circuit 123 may store data to be programmed in memory cells. The data input/output circuit 124 is connected with the page buffer circuit 123 through the data lines DL. The data input/output circuit 124 may exchange data, DATA, with the memory controller 110.

The data input/output circuit 124 may temporarily store the data received from the memory controller 110. The data input/output circuit 124 may transfer the stored data to the page buffer circuit 123. The data input/output circuit 124 may temporarily store the data transferred from the page buffer circuit 123. The data input/output circuit 124 may transmit the stored data to the memory controller 110. The data input/output circuit 124 may function as a buffer memory.

The control logic circuit 125 receives a command CMD and a control signal CTRL from the memory controller 110. The control logic circuit 125 may decode the received command CMD and may control overall operations of the nonvolatile memory device 120 based on the decoded command.

If the dummy program command is received as the command CMD, the control logic circuit 125 may control the address decoder circuit 122 and the page buffer circuit 123 such that the dummy program operation is performed. For example, the control logic circuit 125 may control the page buffer circuit 123 such that the bit lines BL are biased. The control logic circuit 125 may control the page buffer circuit 123 such that the bit lines BL are biased with a ground voltage. The control logic circuit 125 may control the address decoder circuit 122 such that a program voltage is simultaneously applied to more than one word-line corresponding to the address ADDR. For example, the control logic circuit 125 may control the address decoder circuit 122 such that the program voltage is simultaneously applied to more than one word-line depending on locations of word lines corresponding to the address ADDR.

FIG. 5 is a circuit diagram illustrating a memory block according to an embodiment of the disclosure. Referring to FIG. 5, the memory block BLK1 includes a plurality of cell strings CS11, CS21, CS12, and CS22. The plurality of cell strings CS11, CS21, CS12, and CS22 may be arranged along a row direction and a column direction to constitute rows and columns.

For example, the cell strings CS11 and CS12 arranged along the row direction may constitute a first row, and the cell strings CS21 and CS22 arranged along the row direction may constitute a second row. The cell strings C11 and C21 arranged along the column direction may constitute a first column, and the cell strings CS12 and CS22 arranged along the column direction may constitute a second column.

Each cell string may include a plurality of cell transistors. In each cell string, the cell transistors include ground selection transistors GSTa and GSTb, memory cells MC1 to MC6, and string selection transistors SSTa and SSTb. The ground selection transistors GSTa and GSTb, the memory cells MC1 to MC6, and the string selection transistors SSTa and SSTb in each cell string may be stacked in a height direction perpendicular to a plane (e.g., a plane on a substrate of the memory block BLK1) on which the cell strings CS11, CS21, CS12, and CS22 are arranged along the rows and the columns.

Each cell transistor may be a charge trap type cell transistor of which the threshold voltage changes depending on the amount of charges trapped in an insulating layer thereof.

The lowermost ground selection transistors GSTa may be connected in common to a common source line CSL.

The ground selection transistors GSTa and GSTb of the cell strings CS11, CS21, CS12, and CS22 may be connected in common to a ground selection line GSL.

In an embodiment, ground selection transistors of the same height (or order) may be connected to the same ground selection line, and ground selection transistors of different heights (or orders) may be connected to different ground selection lines. For example, the ground selection transistors GSTa of a first height may be connected in common to a first ground selection line, and the second ground selection transistors GSTb of a second height may be connected in common to a second ground selection line.

In an embodiment, ground selection transistors in the same row may be connected to the same ground selection line, and ground selection transistors of different rows may be connected to different ground selection lines. For example, the ground selection transistors GSTa and GSTb of the cell strings CS11 and CS12 in the first row may be connected to a first ground selection line, and the ground selection transistors GSTa and GSTb of the cell strings CS21 and CS22 in the second row may be connected to a second ground selection line.

Memory cells placed at the same height (or order) from the substrate (or the ground selection transistors GSTa or GSTb) may be connected in common to one word-line, and memory cells placed at different heights (or, orders) may be respectively connected to different word lines WL1 to WL6. For example, the memory cells MC1 are connected in common to the word line WL1. The memory cells MC2 are connected in common to the word line WL2. The memory cells MC3 are connected in common to the word line WL3. The memory cells MC4 are connected in common to the word line WL4. The memory cells MC5 are connected in common to the word line WL5. The memory cells MC6 are connected in common to the word line WL6.

In the first string selection transistors SSTa of the cell strings CS11, CS21, CS12, and CS22 that have the same height (or order), the first string selection transistors SSTa in different rows are respectively connected to different string selection lines SSL1a and SSL2a. For example, the first string selection transistors SSTa of the cell strings CS11 and CS12 are connected in common to the string selection line SSL1a. The first string selection transistors SSTa of the cell strings CS21 and CS22 are connected in common to the string selection line SSL2a.

In the second string selection transistors SSTb of the cell strings CS11, CS21, CS12, and CS22 which have the same height (or order), the second string selection transistors SSTb in different rows are respectively connected to different string selection lines SSL1b and SSL2b. For example, the second string selection transistors SSTb of the cell strings CS11 and CS12 are connected in common to the string selection line SSL1b. The second string selection transistors SSTb of the cell strings CS21 and CS22 are connected in common to the string selection line SSL2b.

That is, cell strings in different rows are connected to different string selection lines. String selection transistors, which have the same height (or, order), from among cell strings in the same row are connected to the same string selection line. String selection transistors, which have different heights (or, orders), from among cell strings in the same row are connected to different string selection lines.

In an embodiment, string selection transistors of cell strings in the same row may be connected in common to a string selection line. For example, the string selection transistors SSTa and SSTb of the cell strings CS11 and CS12 in the first row may be connected in common to a string selection line. The string selection transistors SSTa and SSTb of the cell strings CS21 and CS22 in the second row may be connected in common to a string selection line.

Columns of the cell strings CS11, CS21, CS12, and CS22 may be connected to different bit lines BL1 and BL2. For example, the string selection transistors SSTb of the cell strings CS11 and CS21 in the first column are connected in common to the bit line BL1. The string selection transistors SSTb of the cell strings CS12 and CS22 are connected in common to the bit line BL2.

The cell strings CS11 and CS12 may constitute a first plane. The cell strings CS21 and CS22 may constitute a second plane.

In the memory block BLK1, read and program operations may be performed in units of a row. For example, one plane of the memory block BLKa may be selected by the string selection lines SSL1a, SSL1b, SSL2a, and SSL2b. The cell strings CS11 and CS12 in a first plane may be connected to the bit lines BL1 and BL2 when the turn-on voltage is supplied to the string selection lines SSL1a and SSL1b and the turn-off voltage is supplied to the string selection lines SSL2a and SSL2b. That is, the first plane may be selected. The cell strings CS21 and CS22 in a second plane may be connected to the bit lines BL1 and BL2 when the turn-on voltage is supplied to the string selection lines SSL2a and SSL2b and the turn-off voltage is supplied to the string selection lines SSL1a and SSL1b. That is, the second plane may be selected. In the selected plane, a row of memory cells MC may be selected by the word lines WL1 to WL6. In the selected row, the program or read operation may be performed.

In the memory block BLK1, memory cells may be erased in units of a memory block or a sub-block. When an erase operation is performed in units of a memory block, all memory cells MC in the memory block BLK1 may be simultaneously erased depending on an erase request. When the erase operation is performed in units of a sub-block, some of memory cells MC in the memory block BLK1 may be simultaneously erased depending on an erase request while the remaining memory cells thereof are erase-inhibited. A low voltage (e.g., a ground voltage) may be supplied to a word line connected to erased memory cells, and a word line connected to erase-inhibited memory cells MC may be floated.

The memory block BLK1 illustrated in FIG. 5 is an example. However, embodiments may not be limited thereto. For example, the number of rows of cell strings may increase or decrease. As the number of rows of cell strings varies, the number of string selection lines or ground selection lines connected to rows of cell strings and the number of cell strings connected to a bit line may also vary.

The number of columns of cell strings may increase or decrease. As the number of columns of cell strings varies, the number of bit lines connected to columns of cell strings and the number of cell strings connected to a string selection line may also vary.

A height of the cell strings may increase or decrease. For example, the number of ground selection transistors, memory cells, or string selection transistors that are stacked in each cell string may increase or decrease.

Figure 6:
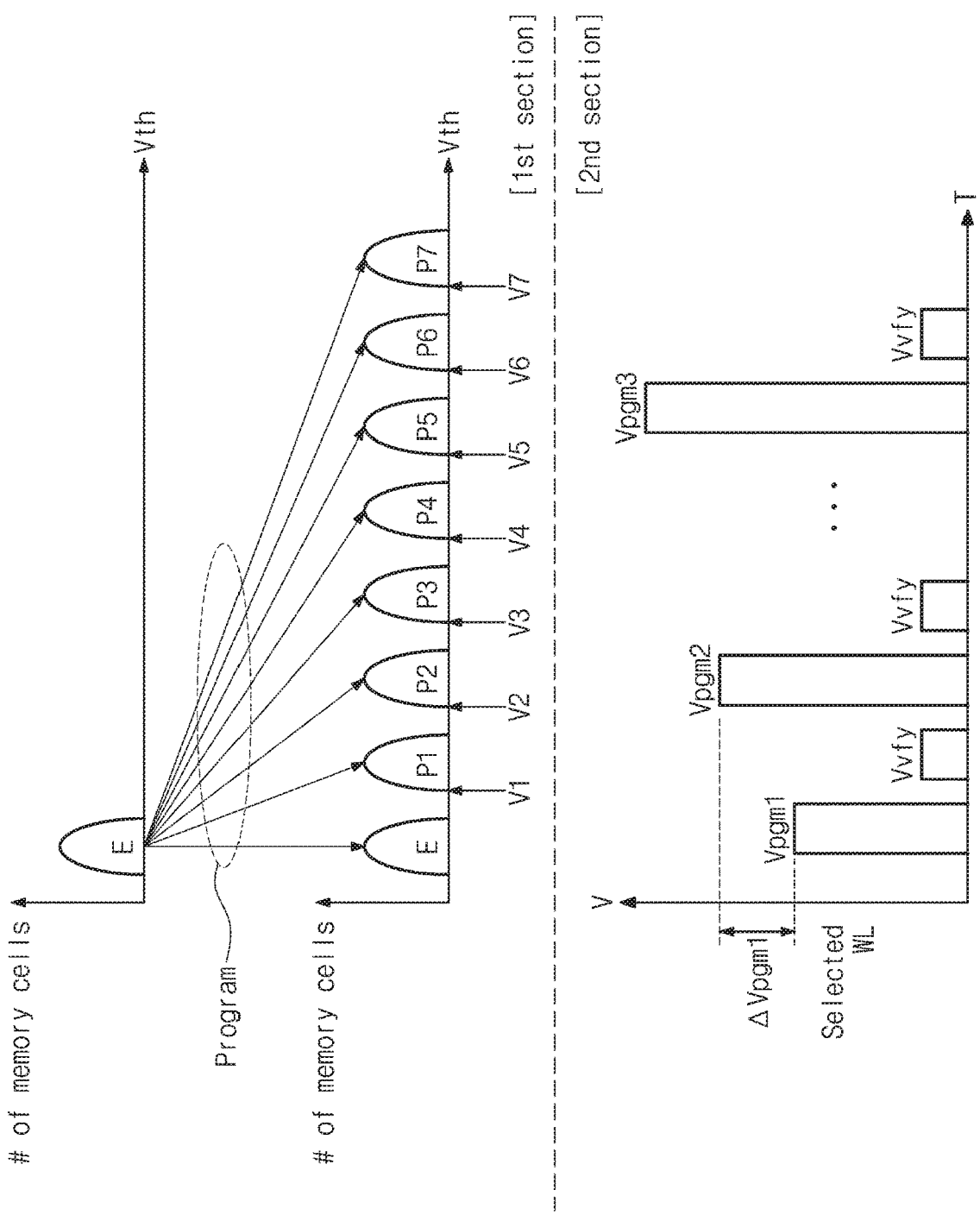
FIG. 6 describes an operation of the nonvolatile memory device of FIG. 5.

FIG. 6 describes an operation of a nonvolatile memory device of FIG. 5. A first section of FIG. 6 shows a threshold voltage distribution of memory cells formed according to each program operation associated with at least one selected word line. A second section of FIG. 6 is a graph illustrating a program voltage and a verification voltage applied to at least one selected word line during a program operation.

In the first section of FIG. 6, a horizontal axis denotes threshold voltages of memory cells MC, and a vertical axis denotes the number of memory cells MC. For example, when a program operation is performed in response to a program command, each memory cell may be programmed to have one among an erase state "E" and first to seventh program states P1 to P7 from the erase state "E". To program memory cells to have the first to seventh program states P1 to P7, a program voltage that is sequentially increased may be applied to a selected word line. That is, a plurality of pulses may be used to apply various levels of program voltages to memory cells. The first to seventh program states P1 to P7 may be verified by using first to seventh program verification voltages V1 to V7.

In the second section of FIG. 6, a horizontal axis denotes time T, and a vertical axis denotes a voltage V. Referring to the second section of FIG. 6, the program voltage Vpgm is applied to at least one selected word line and the verification voltage Vvfy is then applied thereto. As illustrated in the second section of FIG. 6, the nonvolatile memory device 120 may perform a program operation based on an incremental pulse step programming (ISPP) scheme. For example, the program operation may include a plurality of program loops, each of which includes a program step for applying program voltages Vpgm1 to Vpgm3 and a verification step for applying the verification voltage Vvfy. A first program voltage Vpgm1 may be applied to a selected word line in a first program loop, and a second program voltage Vpgm2 that is higher than the first program voltage Vpgm1 by an increment ΔVpgm1 may be applied to the selected word line in a second program loop. That is, the nonvolatile memory device 120 may make threshold voltages of memory cells connected with at least one selected word line different by applying program voltages of different levels to the at least one selected word line. The verification voltage Vvfy may include various levels of verification voltages associated with program voltage Vpgm.

FIG. 7 describes an open memory block among memory blocks of a nonvolatile memory device according to an embodiment of the disclosure. An open memory block includes a word line connected with programmed memory cells and a word line connected with memory cells of an erase state. For example, referring to FIG. 7, the memory block BLK1 includes a plurality of word lines WL1 to WL6. The first to third word lines WL1 to WL3 are program word lines, and the fourth to sixth word lines WL4 to WL6 are erase word lines. That is, the memory block BLK1 of FIG. 7 is an open memory block including the program word lines WL1 to WL3 and the erase word lines WL4 to WL6.

The open memory block is not limited to the memory block BLK1 of FIG. 7. For example, the open memory block may include one or more program word lines and one or more erase word lines. Accordingly, the numbers of erase word lines included in open memory blocks may be different from each other. Also, an order of program word lines and erase word lines of the open memory block is not limited to the memory block BLK1 illustrated in FIG. 7.

As described above, an open memory block may not exist in the nonvolatile memory device 120. In the case where an open memory block is present, the memory cell array 121 may include one or more open memory blocks, and the numbers of erase word lines included in the open memory blocks may be different from each other.

FIG. 8 illustrates an example of closing an open memory block of FIG. 7. Referring to FIGS. 1 and 8, the storage device 100 may perform a dummy program operation to close an open memory block present in the nonvolatile memory device 120. For example, the storage device 100 may close the open memory block BLK1 by applying a dummy program voltage to the erase word lines WL4 to WL6 of the open memory block BLK1. That is, memory cells MC of an erase state connected with the erase word lines WL4 to WL6 may be programmed by the dummy program operation. All the erase word lines WL4 to WL6 included in the open memory block BLK1 may be changed to the program word lines WL4 to WL6 by the dummy program operation. Accordingly, the open memory block BLK1 may be changed to a closed memory block BLK2 by the dummy program operation. That is, all word lines of a closed memory block may be program word lines.

Figure 9:
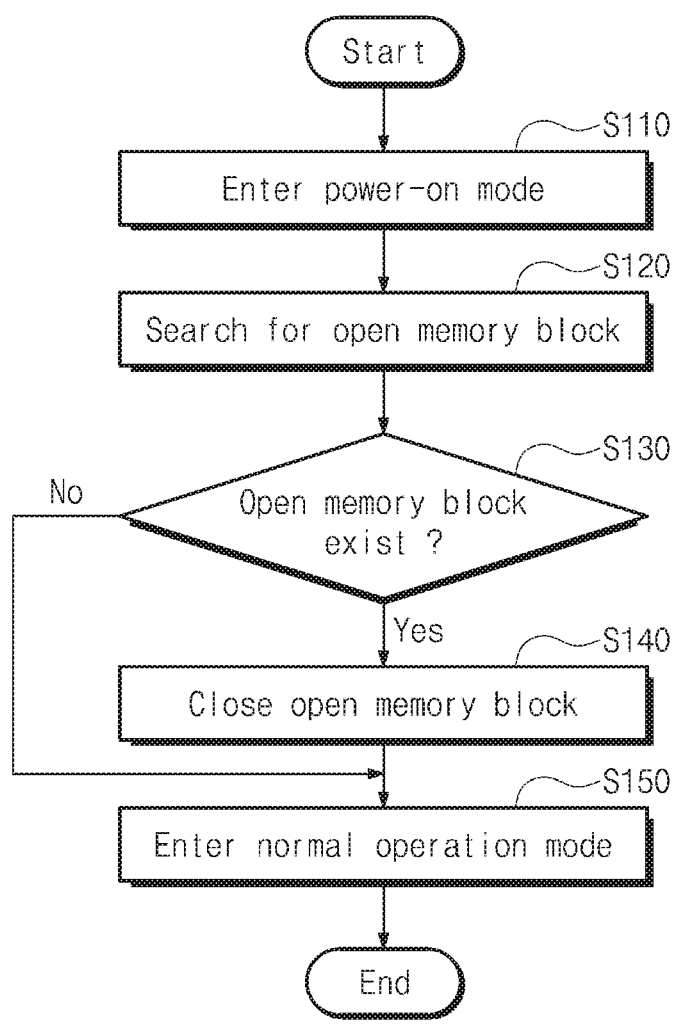
FIG. 9 is a flowchart illustrating a dummy program operation according to an embodiment of the disclosure.

FIG. 9 is a flowchart illustrating a dummy program operation according to an embodiment of the disclosure. For a brief description, a dummy program operation according to an embodiment of the disclosure will be described with reference to the storage device 100. However, embodiments may not be limited thereto. For example, the dummy program operation may be performed through a separate hardware element or a separate software element. For example, the dummy program operation may be performed in the memory controller 110 or the nonvolatile memory device 120 included in the storage device 100. All or some of operations S110 to S150 of FIG. 9 associated with the dummy program operation may be performed in the memory controller 110 or the nonvolatile memory device 120 included in the storage device 100.

Referring to FIGS. 1, 2, and 9, in operation S110, the storage device 100 may enter a power-on mode. The power-on mode may mean a state where supplying of power to the storage device 100 starts. In the case where the storage device 100 changes from a power-off state to a power-on state through power supply, the storage device 100 may enter the power-on mode. In an embodiment, the storage device 100 may execute firmware in the power-on mode.

In operation S120, the storage device 100 searches for an open memory block. The memory controller 110 may search for one or more open memory blocks among memory blocks of the nonvolatile memory device 120. The memory controller 110 may determine not only whether an open memory block is present but also locations of all open memory blocks included in the nonvolatile memory device 120. For example, the memory controller 110 may determine whether the open memory block is present and the locations of the open memory blocks through the FTL 111. Since the FTL 111 manages information about a physical address where data are stored, the memory controller 110 may determine locations of program word lines and the number of program word lines by using the physical address information. The memory controller 110 may determine whether an open memory block among memory blocks is present, based on the locations and the number of the determined program word lines. Accordingly, the memory controller 110 may determine the existence of an open memory block and a location of the open memory block.

The storage device 100 may enter the normal operation mode after power-on mode. In operation S130 to operation S150, if an open memory block does not exist in the nonvolatile memory device 120, as determined in operation S130, the storage device 100 enters a normal operation mode S150. If an open memory block exists in the nonvolatile memory device 120, as determined in operation S130, the storage device 100 may close one or more open memory blocks, through operation S140. The storage device 100 enters the normal operation mode after closing the open memory block(s). The normal operation mode may refer to a state where the storage device 100 is able to perform program, read, and erase operations on the nonvolatile memory device 120. For example, the storage device 100 may enter the normal operation mode after performing a preparation operation to perform the program, read, and erase operations on the nonvolatile memory device 120 in the power-on mode.

In operation S140, the storage device 100 may perform a dummy program operation to close an open memory block. The storage device 100 may close one or more open memory blocks present in the nonvolatile memory device 120. The storage device 100 may simultaneously perform the dummy program operation on open memory blocks to close the open memory blocks. The storage device 100 may perform the dummy program operation on one or more erase word lines of an open memory block. The storage device 100 may program memory cells MC connected to a plurality of erase word lines by performing the dummy program operation on the plurality of erase word lines at the same time. For example, the memory controller 110 may transmit the dummy program command CMD to the nonvolatile memory devices 120 to perform the dummy program operation. The memory controller 110 may transmit one or more addresses ADDR representing one or more erase word lines on which the dummy program operation is performed such that programming is performed on one or more erase word lines of an open memory block.

In the case where supplying power to the storage device 100 is interrupted while an open memory block is included in the nonvolatile memory device 120, memory cells of an erase word line(s) of the open memory block may be left at an erase state. In an open memory block, if a time when memory cells of an erase word line are left at an erase state becomes longer, the memory cells may deteriorate. The storage device 100 may close an open memory block in the power-on mode, thus preventing memory cells of an erase word line of the open memory block from being left at an erase state for a long time. The storage device 100 may prevent deterioration by quickly programming memory cells left at an erase state while power supply is interrupted. Accordingly, the reliability of the storage device 100 may be improved.

Figure 10:
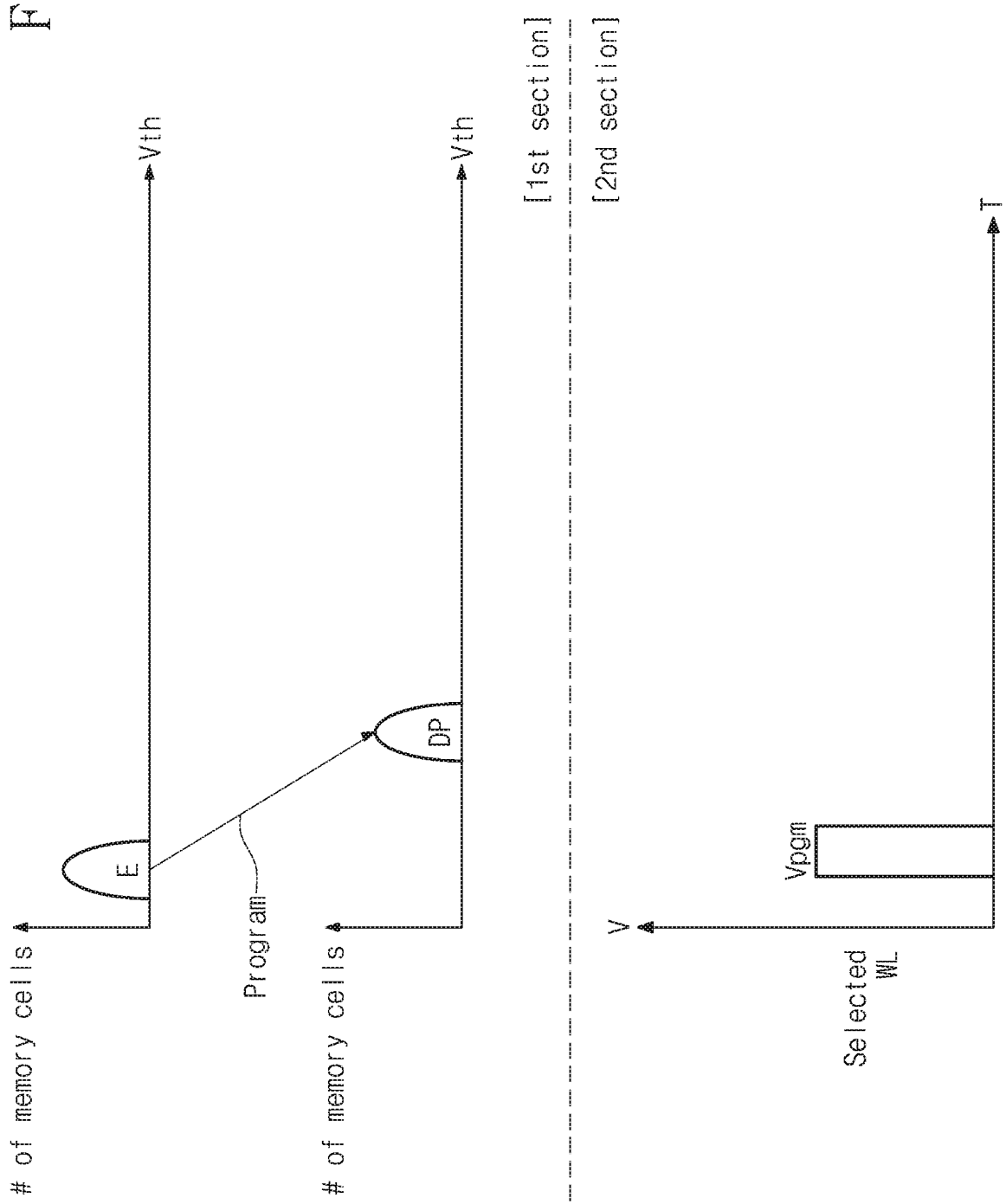
FIG. 10 describes a dummy program operation according to an embodiment of the disclosure.

FIG. 10 describes a dummy program operation according to an embodiment of the disclosure. A first section of FIG. 10 shows a change in a threshold voltage distribution of memory cells when a dummy program operation is performed in response to a dummy program command. A second section of FIG. 10 is a graph illustrating a program voltage applied to at least one selected word line during the dummy program operation.

In the first section of FIG. 10, a horizontal axis denotes threshold voltages of memory cells MC, and a vertical axis denotes the number of memory cells MC. For example, when the dummy program operation is performed in response to the dummy program command, each memory cell may be programmed to have a dummy program state DP from the erase state "E". The dummy-programmed memory cells may not have the erase state "E". That is, the memory cells may be programmed to have the dummy program state DP, the threshold voltage distribution range of which is higher than that of the erase state "E". In an embodiment, the lower limit of the threshold voltage distribution range of the dummy program state DP may be the same as or higher than the upper limit of the threshold voltage distribution range of the erase state "E". To program memory cells MC to the dummy program state DP, one program voltage may be applied to the memory cells MC. That is, a pulse may be used to apply a program voltage to memory cells once.

In the second section of FIG. 10, a horizontal axis denotes time T, and a vertical axis denotes a voltage V. Referring to the second section of FIG. 10, the program voltage Vpgm is applied to at least one selected word line Selected WL during the dummy program operation. In an embodiment, the dummy program operation associated with the memory cells may be completed by applying one positive high voltage (e.g., a program voltage) to a word line connected to control gates of the memory cells. During the dummy program operation, the memory cells may be programmed without a verification operation.

Compared with the program operation of FIG. 6, a program time of the dummy program operation of FIG. 10 may be shortened by applying only one program pulse to the memory cells MC for the purpose of programming the memory cells MC.

Figure 11:
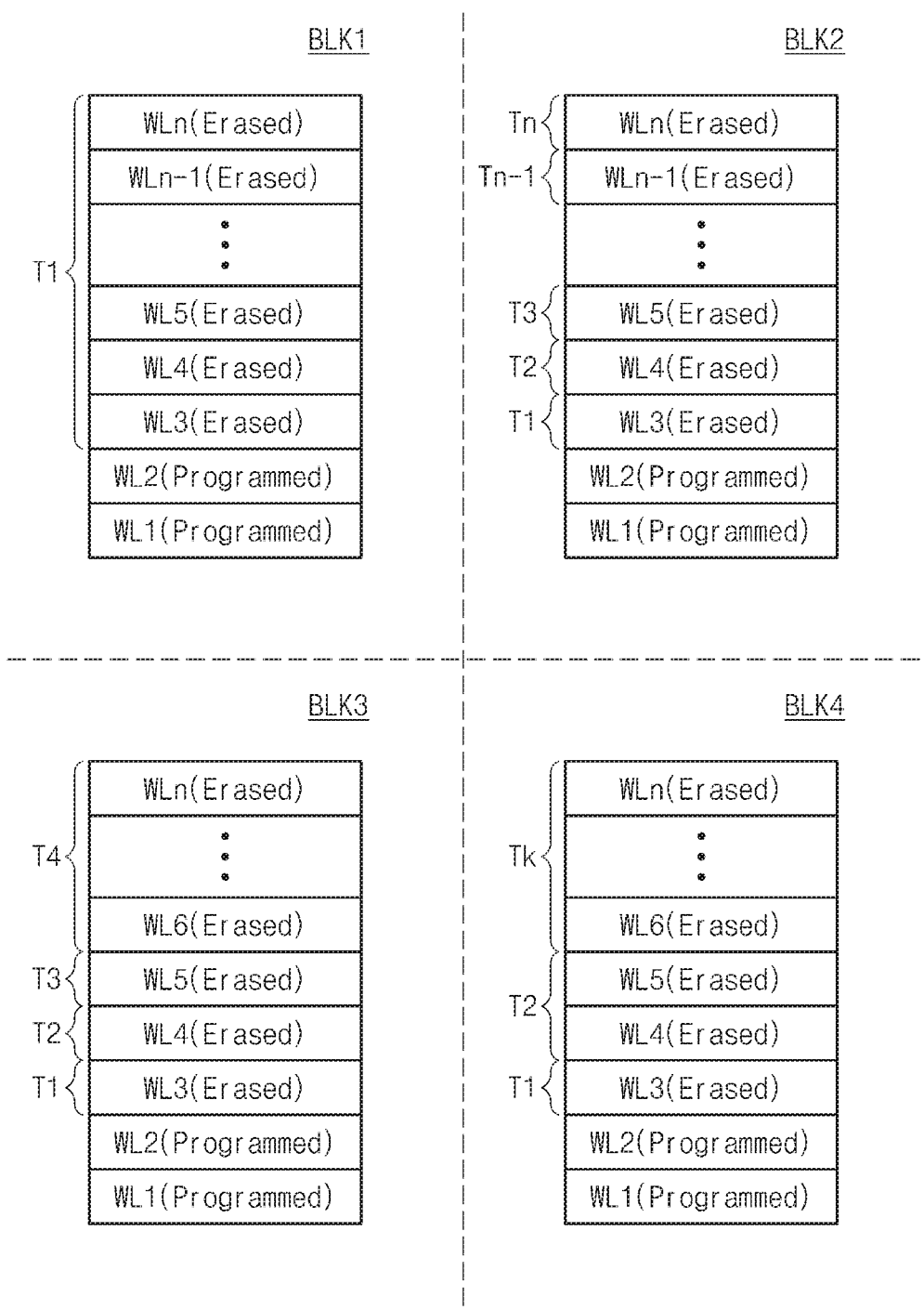
FIG. 11 illustrates an operation of closing an open memory block, according to an embodiment of the disclosure.

FIG. 11 illustrates an operation of closing an open memory block, according to an embodiment of the disclosure. Referring to FIG. 11, the storage device 100 may close an open memory block by performing a dummy program operation in various manners. In FIG. 11, it is assumed that the open memory block BLK1 includes first and second program word lines and third to n-th erase word lines. However, embodiments may not be limited thereto. For example, embodiments may be applied to an open memory block including the various numbers of program word lines and the various numbers of erase word lines.

In an embodiment, the storage device 100 may apply a program voltage to the erase word lines WL3 to WLn of the open memory block BLK1 at the same time T1. The storage device 100 may close the open memory block BLK1 by performing the dummy program operation on the erase word lines WL3 to WLn at the same time. The storage device 100 may shorten a program time by performing the dummy program operation on the erase word lines WL3 to WLn at the same time.

In an embodiment, the storage device 100 may apply a program voltage to the erase word lines WL3 to WLn of the open memory block BLK2 at different times T1-Tn. The storage device 100 may sequentially perform the dummy program operation from the erase word line WL3 closest to the program word lines WL1 and WL2. The storage device 100 may close an open memory block BLK2 by performing the dummy program operations on the erase word lines WL3 to WLn at different times.

In an embodiment, the storage device 100 may perform the dummy program operations on the erase word lines WL3 to WL5 placed within a specific distance from the program word lines WL1 and WL2 of an open memory block BLK3 at different times T1-T3. The storage device 100 may apply a program voltage to the erase word line WL3 at a first time T1, may apply the program voltage to the erase word line WL4 at a second time T2, and may apply the program voltage to the erase word line WL5 at a third time T3. The storage device 100 may perform the dummy program operations on the erase word lines WL6 to WLn spaced apart from the program word lines WL1 and WL2 by a specific distance or more at a time different from those of the erase word lines WL3 to WL5. The storage device 100 may apply the program voltage to the erase word lines WL6 to WLn at a fourth time T4.

In an embodiment, the storage device 100 may apply the program voltage to the erase word line WL3 closest to the program word lines WL1 and WL2 of an open memory block BLK4 at a first time T1. The storage device 100 may apply the program voltage to the remaining erase word lines WL4 and WL5 among the erase word lines WL3 to WL5 except for the erase word line WL3 closest to the program word lines WL1 and WL2 at a second time T2. Here, the erase word lines WL3 to WL5 may be placed within a specific distance from the program word lines WL1 and WL2. The storage device 100 may apply the program voltage to the erase word lines WL6 to WLn spaced apart from the program word lines WL1 and WL2 by more than the specific distance at different times Tk.

The storage device 100 according to an embodiment of the disclosure may perform program operations on erase word lines at different times based on a physical distance between a program word line and an erase word line. Accordingly, the storage device 100 may reduce coupling noise associated with memory cells connected to a program word line by performing the dummy program operations on two or more erase word lines adjacent to a program word line at different times.

A method in which the storage device 100 according to an embodiment of the disclosure performs the dummy program operation on an open memory block is not limited to the methods described with reference to FIG. 11 and may include any method in which program operations are performed on erase word lines at different times depending on a distance from a program word line.

Figure 12:
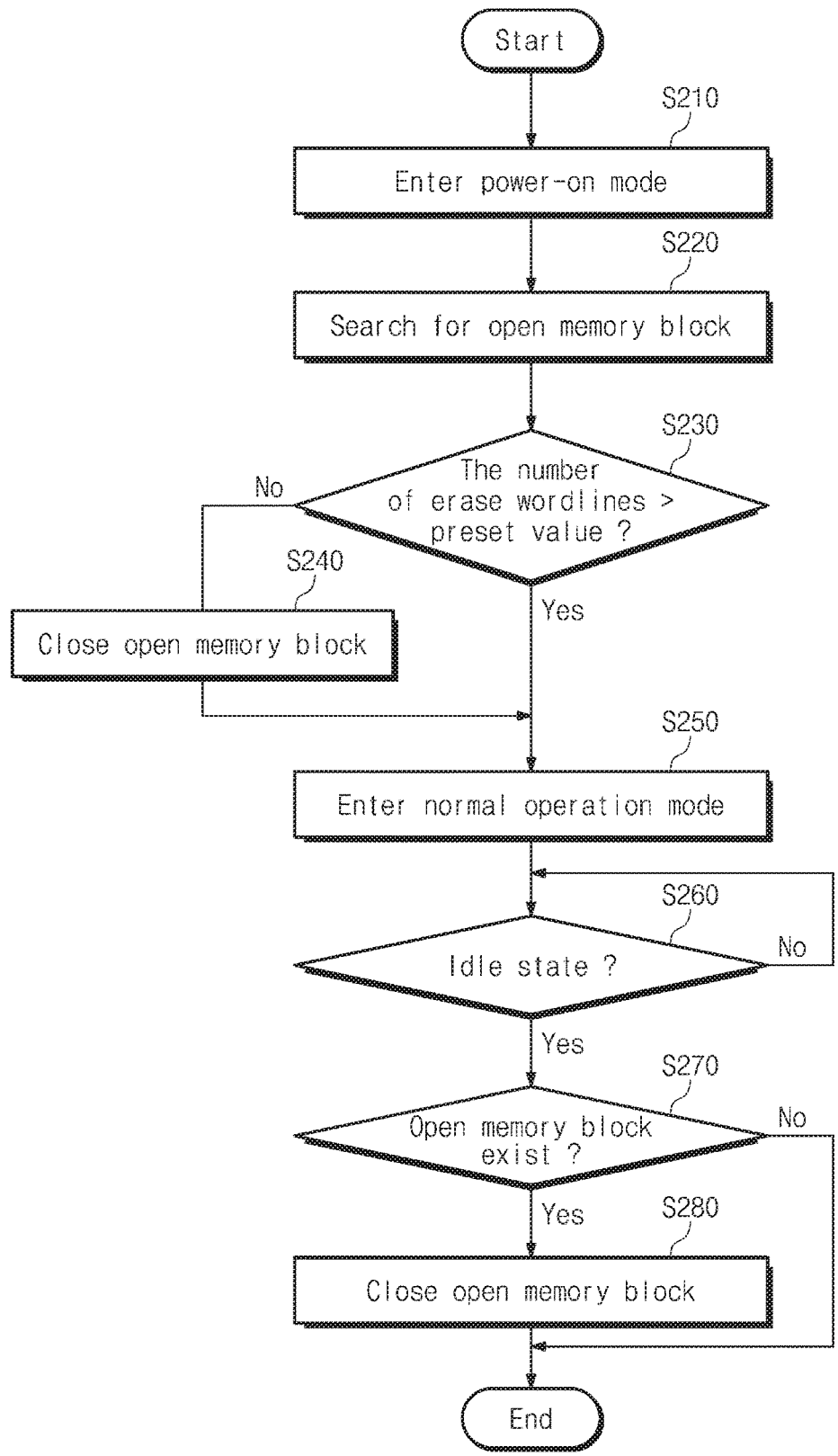
FIG. 12 is a flowchart illustrating a dummy program operation according to another embodiment of the disclosure.

FIG. 12 is a flowchart illustrating a dummy program operation according to another embodiment of the disclosure. For a brief description, a dummy program operation according to an embodiment of the disclosure will be described with reference to the storage device 100. In operation S210, the storage device 100 may enter a power-on mode. In operation S220, the storage device 100 searches for an open memory block. Operation S210 and operation S220 may be similar to operation S110 to operation S130 of FIG. 9, and a detailed description thereof will not be repeated here. Below, an operation after the storage device 100 searches for an open memory block will be more fully described with reference to FIGS. 1 and 12.

In operation S230, the storage device 100 compares the number of erase word lines of at least one open memory block with a preset value. In an embodiment, the storage device 100 may determine whether the number of erase word lines of at least one open memory block included in the nonvolatile memory device 120 exceeds the preset value. The storage device 100 may perform operation S230 by using the number of erase word lines of all open memory blocks included in the nonvolatile memory device 120.

The preset value may be determined based on a resource of the storage device 100. For example, in the case where a resource used in the storage device 100 is great, the preset value may be small; and, in the case where a resource used in the storage device 100 is small, the preset value may be great.

If the number of erase word lines is not more than the preset value, in operation S240, the storage device 100 closes the open memory block. In an embodiment, the storage device 100 may close open memory blocks that are used as a reference to determine the number of erase word lines in operation S230. For example, in the case where whether the number of erase word lines exceeds the preset value is determined on the basis of all open memory blocks, the storage device 100 may close all the open memory blocks. The storage device 100 may close all the open memory blocks if the number of erase word lines of all the open memory blocks is not more than the preset value. The storage device 100 may perform the dummy program operation to close an open memory block.

In the case where the number of erase word lines exceeds the preset value, in operation S230 and operation S250, the storage device 100 enters the normal operation mode without closing an open memory block.

In operation S260, the storage device 100 determines whether the storage device 100 is in an idle state. The idle state means a state where there is not performed an operation to use a resource of the storage device 100 such as a program operation, a read operation, or an erase operation. In an embodiment, the storage device 100 may determine whether the nonvolatile memory device 120 is in the idle state. For example, the storage device 100 may determine whether the nonvolatile memory device 120 is in the idle state, based on whether the nonvolatile memory device 120 uses a resource.

In the case where the nonvolatile memory device 120 is in the idle state, in operation S270 and operation S280, the storage device 100 may search for an open memory block to determine whether an open memory block exists in a normal operation mode S270. In an embodiment, the open memory block in the normal operation mode may include an open memory block not programmed in the power-on mode and an open memory block newly generated in the normal operation mode. For example, the storage device 100 may determine whether an open memory block is present S270, by searching for an open memory block, which is not found in the power-on mode, in an idle state.

In the case where an open memory block exists, the storage device 100 closes the open memory block S280. In the case where an open memory block is absent from the nonvolatile memory device 120, the storage device 100 may not perform the dummy program operation. For example, in operation S230 and operation S240, in the case where the storage device 100 performs an operation to close all open memory blocks, an open memory block may be absent from the nonvolatile memory device 120, and thus, the storage device 100 may not perform the dummy program operation.

Accordingly, the storage device 100 according to another embodiment of the disclosure may make a time to close an open memory block different based on the number of erase word lines. In the power-on mode, the storage device 100 may use a lot of resources due to a preparation operation for entering the normal operation mode. Since a resource used in the power-on mode is considered, the storage device 100 may perform an open memory block closing operation in the case where the number of erase word lines is not more than a specific value. The storage device 100 may close all open memory blocks included in the nonvolatile memory device 120 in an idle state where the amount of used resources is small. Accordingly, when performing the dummy program operation, the storage device 100 may prevent deterioration of memory cells and may efficiently use the resources of the storage device 100.

Figure 13:
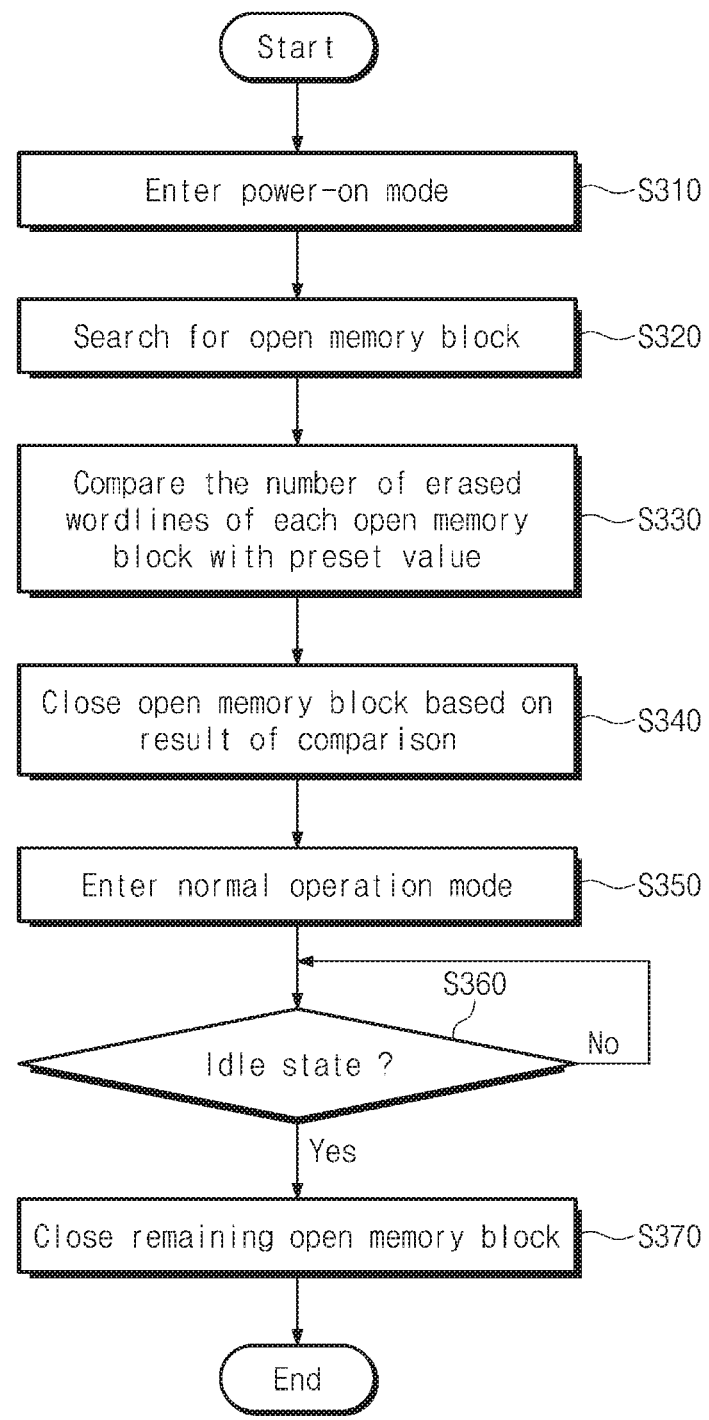
FIG. 13 is a flowchart illustrating a dummy program operation according to another embodiment of the disclosure.

FIG. 13 is a flowchart illustrating a dummy program operation according to another embodiment of the disclosure. For a brief description, a dummy program operation according to an embodiment of the disclosure will be described with reference to the storage device 100. In operation S310, the storage device 100 may enter a power-on mode. In operation S320, the storage device 100 searches for an open memory block. Operation S310 and operation S320 may be similar to operation S110 to operation S130 of FIG. 9, and a detailed description thereof will not be repeated here. Below, an operation after the storage device 100 searches for an open memory block will be more fully described with reference to FIGS. 1 and 13.

In operation S330, the storage device 100 compares the number of erase word lines of each of one or more open memory blocks found in operation S320 with a preset value. In operation S340, the storage device 100 closes an open memory block based on the comparison result of operation S330. In an embodiment, in the case where the number of erase word lines of any one open memory block is not more than the preset value, the storage device 100 may close the open memory block. In the case where the number of erase word lines of any one open memory block exceeds the preset value, the storage device 100 may not close the open memory block. Accordingly, in the power-on mode, each of open memory blocks may be selectively closed based on the number of erase word lines.

In operation S350, the storage device 100 enters the normal operation mode. When the storage device 100 is in the normal operation mode, an open memory block may be absent from the nonvolatile memory device 120. In an embodiment, in the case where it is determined in operation S330 that the number of erase word lines of all open memory blocks is not more than the preset value, an open memory block may be absent from the nonvolatile memory device 120. Also, when the storage device 100 is in the normal operation mode, an open memory block may be present in the nonvolatile memory device 120. In an embodiment, in the case where it is determined in operation S330 that the number of erase word lines of any one open memory block exceeds the preset value, an open memory block may be present in the nonvolatile memory device 120.

In the case where the storage device 100 is in an idle state, as determined in operation S360, the storage device 100 closes remaining open memory blocks in operation S370. In the case where the storage device 100 does not come into the idle state, even though an open memory block is present, the storage device 100 may not close the remaining open memory block. If an open memory block does not exist even though the storage device 100 comes into the idle state, operation S370 may not be performed.

Figure 14:
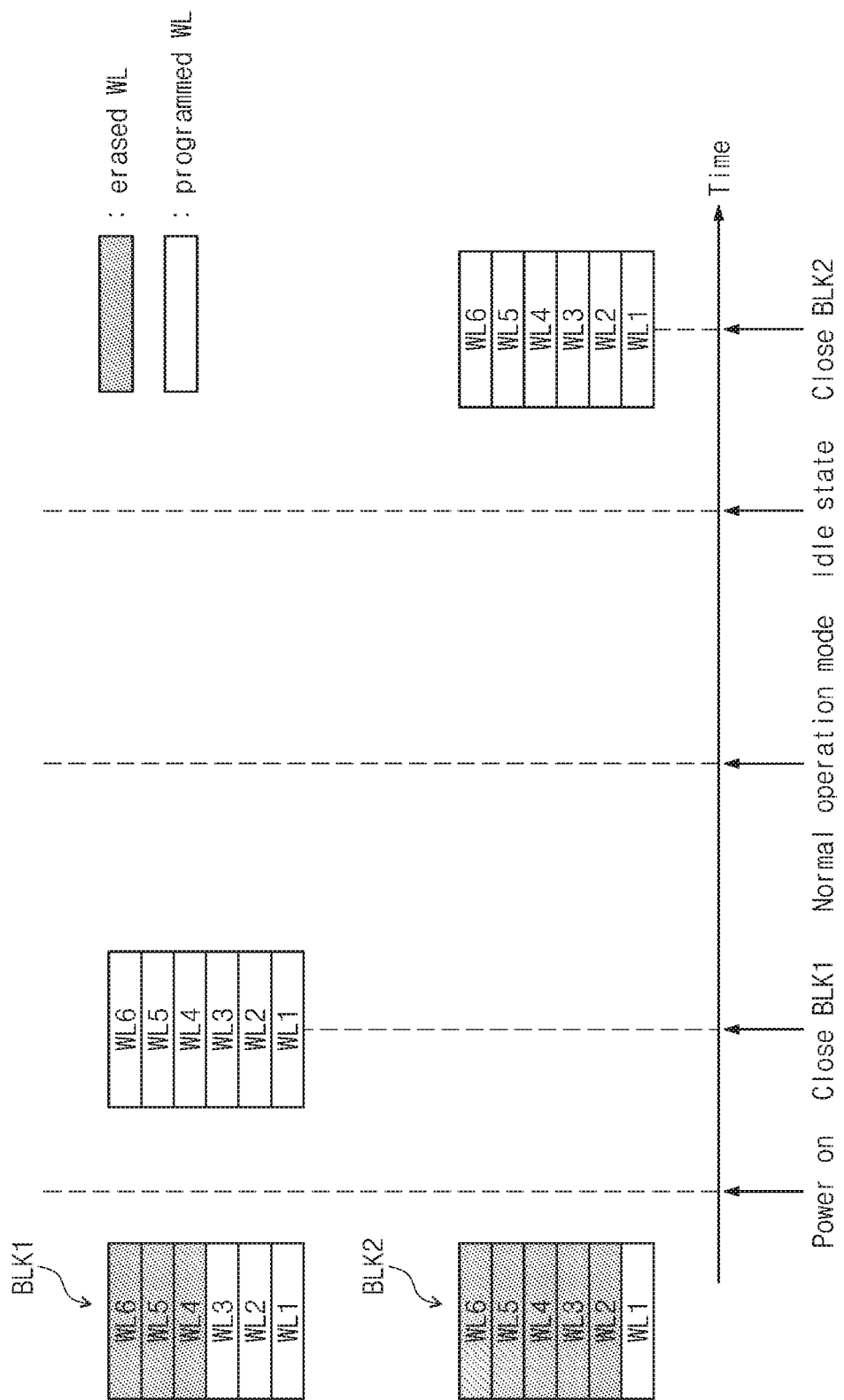
FIG. 14 illustrates an example in which the storage device performs a dummy program operation depending on an operating method of FIG. 13.

FIG. 14 illustrates an example in which a storage device performs a dummy program operation depending on an operating method of FIG. 13. In FIG. 14, a horizontal axis represents time, and a first open memory block BLK1 and a second open memory block BLK2 are included in the nonvolatile memory device 120. The number of erase word lines WL4 to WL6 of the first open memory block BLK1 is "3", and the number of erase word lines WL2 to WL6 of the second open memory block BLK2 is "5".

According to operation S310 and operation S320 of FIG. 13, if the storage device 100 enters the power-on mode, the storage device 100 retrieves open memory blocks present in the nonvolatile memory device 120 to find the first open memory block BLK1 and the second open memory block BLK2. According to operation S330, the storage device 100 compares the number of erase word lines of each of the first open memory block BLK1 and the second open memory block BLK2 with a preset value. In case of FIG. 14, it is assumed that the preset value is "4". In this case, the number of erase word lines of the first open memory block BLK1 is not more than the preset value. In contrast, since the number of erase word lines of the second open memory block BLK2 is "5", it exceeds the preset value. According to operation S340, the storage device 100 closes the first open memory block BLK1 by performing the dummy program operation only on the erase word lines WL4 to WL6 of the first open memory block BLK1.

According to operation S350, the storage device 100 enters the normal operation mode after closing only the first open memory block BLK1 in the power-on mode. According to operation S360 and operation S370, if coming into the idle state, the storage device 100 closes the second open memory block BLK2 by performing the dummy program operation on the erase word lines WL2 to WL6 of the second open memory block BLK2. The storage device 100 may close the first open memory block BLK1 having the small number of erase word lines earlier than the second open memory block BLK2 having the great number of erase word lines.

The method for performing the dummy program operation according to another embodiment of the disclosure is not limited to an example of FIG. 14. For example, the number of open memory blocks and the number of erase word lines included in an open memory block may be variously changed or modified.

The storage device 100 according to another embodiment of the disclosure may make a time to close an open memory block different depending on the number of erase word lines with respect to each of the open memory blocks. Accordingly, the storage device 100 may reduce the amount of resources used in the power-on mode by performing the dummy program operation on open memory blocks, in which the number of erase word lines is small, in the power-on mode. The storage device 100 may efficiently use resources by performing the dummy program operation on open memory blocks, in which the number of erase word lines are great, in an idle state.

Figure 15:
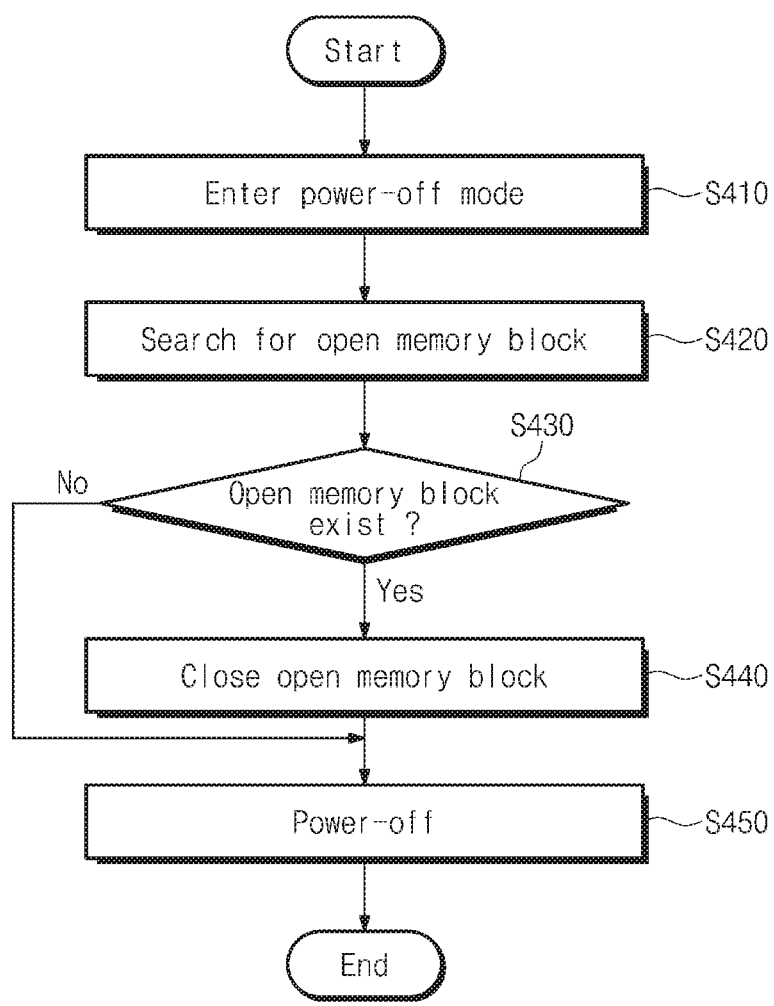
FIG. 15 is a flowchart illustrating a dummy program operation according to another embodiment of the disclosure.

FIG. 15 is a flowchart illustrating a dummy program operation according to another embodiment of the disclosure. For a brief description, a dummy program operation according to an embodiment of the disclosure will be described with reference to the storage device 100.

Referring to FIGS. 1, 3, and 15, in operation S410, the storage device 100 may enter a power-off mode. The power-off mode may mean a preparation state for interrupting power supply. If receiving a power-off command from a host, the storage device 100 may enter the power-off mode. The storage device 100 may transmit a part of data stored in the RAM 114 to the nonvolatile memory device 120 in the power-off mode.

In operation S420, the storage device 100 searches for an open memory block. In operation S430 and operation S440, in the case where an open memory block exists, as determined in operation S430, the storage device 100 closes the open memory block in operation S440. Operation S420 to operation S440 may be similar to operation S120 to operation S140 of FIG. 9, and a detailed description thereof will not be repeated here. If an open memory block does not exist or after an open memory block is closed, in operation S450, the storage device 100 is powered off.

Accordingly, the storage device 100 according to another embodiment of the disclosure may prevent memory cells from being left at an erase state while power supply is interrupted, by closing an open memory block present in the nonvolatile memory device 120 before the power supply is interrupted. This may mean that the storage device 100 prevents deterioration of memory cells.

The storage device 100 according to another embodiment of the disclosure is not limited to the above description. For example, the storage device 100 according to another embodiment of the disclosure may perform the dummy program operation based on the operating method described with reference to FIGS. 12 and 13. That is, when closing an open memory block in the power-off mode, the storage device 100 may close an open memory block based on the number of erase word lines. In the case where the number of erase word lines exceeds a preset value, the storage device 100 may fail to close at least one open memory block. The storage device 100 may enter the power-on mode to close an open memory block that the storage device 100 fails to close. That is, the storage device 100 may close an open memory block that the storage device 100 fails to close in the power-off mode, in the power-on mode. In the case of closing an open memory block in the power-on mode, the storage device 100 may close the open memory block depending on the embodiments described with reference to FIGS. 9, 12, and 13. A preset value of the power-off mode and a preset value of the power-on mode may be different. The preset value may be determined in consideration of resources used in each mode and may be differently determined depending on resources used in the same mode.

Figure 16:
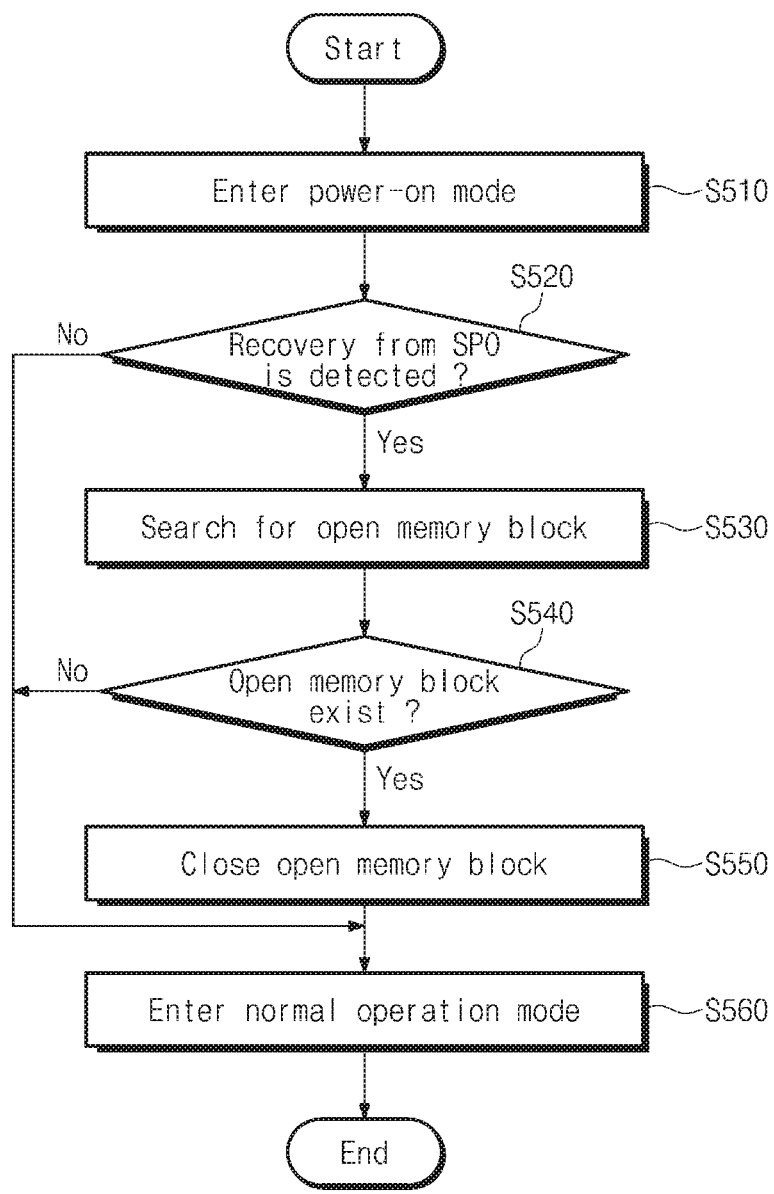
FIG. 16 is a flowchart illustrating a dummy program operation according to another embodiment of the disclosure.

FIG. 16 is a flowchart illustrating a dummy program operation according to another embodiment of the disclosure. For a brief description, a dummy program operation according to an embodiment of the disclosure will be described with reference to the storage device 100. However, embodiments may not be limited thereto. For example, the dummy program operation may be performed through a separate hardware element or a separate software element. For example, the dummy program operation may be performed in the memory controller 110 or the nonvolatile memory device 120 included in the storage device 100. All or some of operations S510 to S550 of FIG. 16 associated with the dummy program operation may be performed in the memory controller 110 or the nonvolatile memory device 120.

Referring to FIGS. 1 and 16, in operation S510, the storage device 100 may enter a power-on mode. In operation S520, the storage device 100 may detect whether a recovery operation from sudden power off (SPO) is performed. The storage device 100 may detect whether power is supplied after the power is suddenly interrupted. For example, the storage device 100 may detect whether the storage device 100 is recovered from the SPO, with reference to meta data or user data stored in the nonvolatile memory device 120.

In the case where the recovery from the SPO is detected, in operation S530, the storage device 100 searches for an open memory block. In operation S540 and operation S550, in the case where an open memory block exists, as determined in operation S540, the storage device 100 closes the open memory block in operation S550. In the case where the recovery from the SPO is not detected in operation S520 or in the case where it is determined in operation S540 that an open memory block does not exist, the storage device 100 does not close the open memory block. In operation S560, the storage device 100 enters the normal operation mode. An operating method that the storage device 100 performs in operation S530 to operation S560 is similar to an operating method that the storage device 100 performs in operation S120 to operation S150 of FIG. 9, and a description thereof will not be repeated here.

The method for performing the dummy program operation described with reference to FIG. 15 may be difficult to apply in the case where the storage device 100 experiences the SPO. According to the method for performing the dummy program operation described with reference to FIG. 15, in the case where the SPO occurs, memory cells MC may be prevented from deteriorating by closing an open memory block after power is again supplied to the storage device 100.

The storage device 100 according to another embodiment of the disclosure is not limited to the above description. For example, the storage device 100 according to another embodiment of the disclosure may perform the dummy program operation based on the operating method described with reference to FIGS. 12 and 13. That is, the storage device 100 may close an open memory block based on the number of erase word lines. On the basis of the number of erase word lines, the storage device 100 may close an open memory block in the power-on mode or may close an open memory block in an idle state of the normal operation mode.

Figure 17:
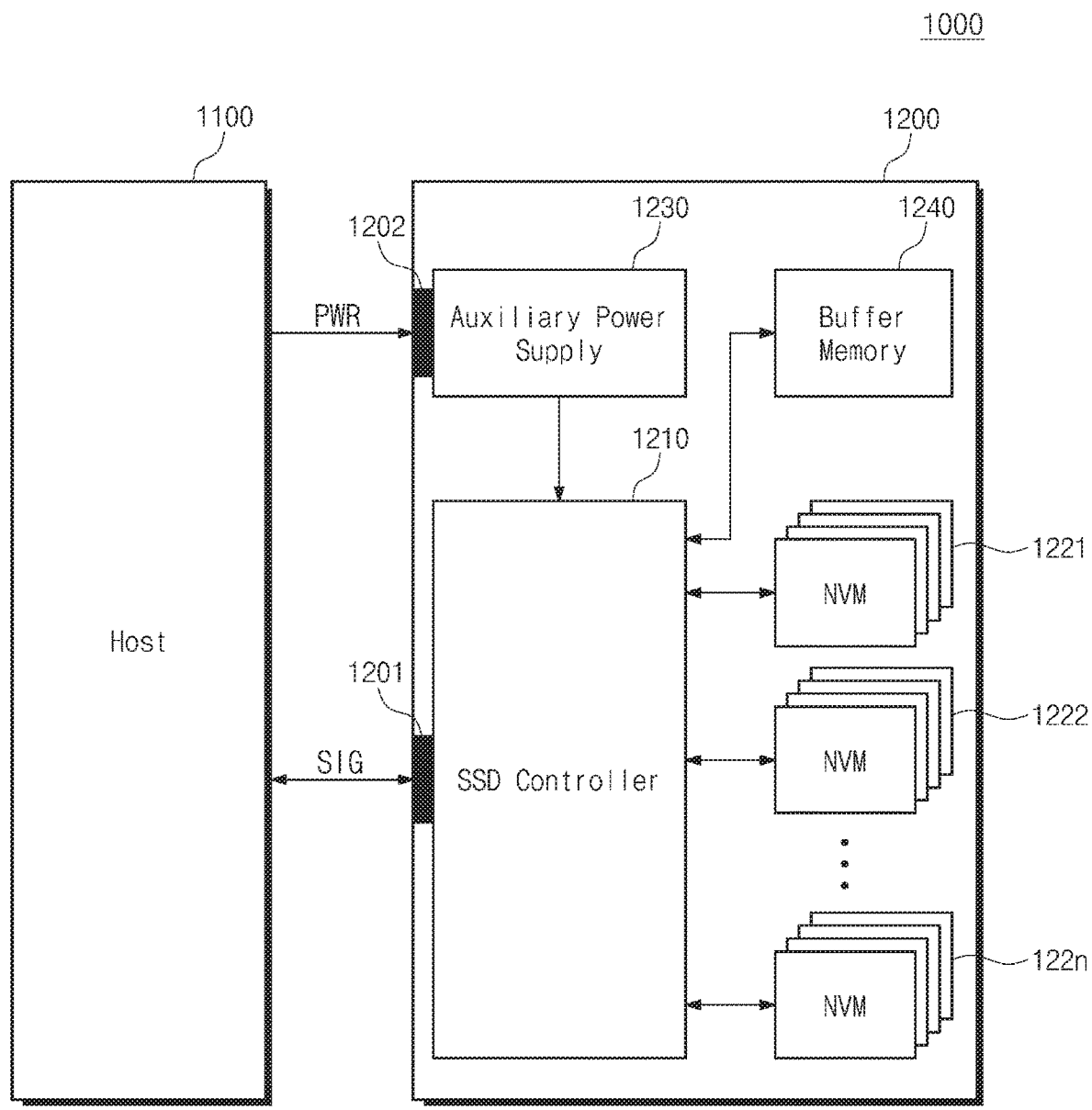
FIG. 17 is a block diagram illustrating a solid state drive (SSD) system according to an embodiment of the disclosure.

FIG. 17 is a block diagram illustrating a solid state drive (SSD) system according to an embodiment of the disclosure. Referring to FIG. 17, a solid state drive (SSD) system 1000 includes a host 1100 and an SSD 1200.

The SSD 1200 exchanges signals SIG with the host 1100 through a signal connector 1201 and is supplied with power PWR through a power connector 1202. The SSD 1200 includes an SSD controller 1210, a plurality of flash memories 1221 to 122n, an auxiliary power supply 1230, and a buffer memory 1240.

The SSD controller 1210 may control the flash memories 1221 to 122n in response to the signal SIG from the host 1100. The flash memories 1221 to 122n may perform a program operation in response to control of the SSD controller 1210. In an embodiment, the SSD controller 1210 may perform the dummy program operation depending on the methods described with reference to FIGS. 1 to 16.

The auxiliary power supply 1230 is connected with the host 1100 through the power connector 1202. The auxiliary power supply 1230 may be charged by the power PWR from the host 1100. When the power is not smoothly supplied from the host 1100, the auxiliary power supply 1230 may power the SSD system 1200.

The buffer memory 1240 operates as a buffer memory of the SSD 1200. For example, the buffer memory 1240 may temporarily store data received from the host 1100 or from the flash memories 1221 to 122n or may temporarily store metadata (e.g., mapping tables) of the flash memories 1221 to 122n. Alternatively, the buffer memory 1240 may temporarily store a variety of information needed for the SSD controller 1210 to operate. In an embodiment, the SSD controller 1210 may search for an open memory block by using data stored in the buffer memory 1240. The buffer memory 1240 may store a preset value needed for the SSD controller 1210 to perform the dummy program operation based on the number of erase word lines.

According to an embodiment of the disclosure, it may be possible to prevent deterioration of memory cells occurring when the memory cells are left at an erase state. Accordingly, there may be provided a storage device capable of improving the reliability of a nonvolatile memory device and an operating method thereof.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to embodiments, it will be apparent to those skilled in the art that various changes and modifications may be made without departing from the spirit and scope of the disclosure. Therefore, it should be understood that the above embodiments are not limiting, but illustrative.

What is claimed is:

1. An operating method executed by a storage device that includes a nonvolatile memory device, the method comprising:
    entering a power-on mode;
    searching for an open memory block, which includes at least one erase word line that addresses memory cells existing in an erase state, from among memory blocks within the nonvolatile memory device;
    in response to determining that a number of erase word lines, among the at least one erase word line, within the open memory block is not more than a preset value, programming a dummy value into each memory cell addressed by the at least one erase word line to close the open memory block in the power-on mode; and
    after the power-on mode, entering a normal operation mode, wherein
    memory cells connected to the at least one erase word line into which the dummy value is programmed have a threshold voltage distribution range higher than a threshold voltage distribution range of the erase state.

2. The method of claim 1, wherein in response to determining that the at least one erase word line includes a plurality of erase word lines, the programming of the dummy value is simultaneously applied to the plurality of erase word lines.

3. The method of claim 1, wherein in response to determining that the at least one erase word line includes a plurality of erase word lines, times at which programming on the erase word lines are made different based on a physical distance from a program word line within the open memory block.

4. The method of claim 1, wherein:
    the open memory block includes a first open memory block in which the number of erase word lines is not more than a preset value or a second open memory block in which the number of erase word lines exceeds the preset value, and
    the closing of the open memory block is performed with respect to the first open memory block.

5. The method of claim 1, further comprising:
    determining whether the storage device is in an idle state in the normal operation mode;
    in response to determining that the storage device is in the idle state, determining whether an open memory block in the normal operation mode exists; and
    in response to determining that the open memory block in the normal operation mode exists, closing the open memory block in the normal operation mode, wherein
    the open memory block in the normal operation mode includes an open memory block not programmed in the power-on mode and an open memory block newly generated in the normal operation mode.

6. The method of claim 1, wherein the preset value is determined based on a resource used in the storage device.

7. A storage device comprising:
    a nonvolatile memory device comprising an open memory block having at least one erase word line that addresses memory cells existing in an erase state; and
    a memory controller configured to transmit a program command to the nonvolatile memory device in response to: (1) detecting a powering-on of the storage device and (2) determining that a number of erase word lines, among the at least one erase word line, within the open memory block is not more than a preset value, wherein the nonvolatile memory device closes the open memory block by programming a dummy value into each memory cell addressed by the at least one erase word line within the open memory block in a power-on mode in response to the program command.

8. The storage device of claim 7, wherein the nonvolatile memory device applies a program voltage to the at least one erase word line.

9. The storage device of claim 7, wherein the nonvolatile memory device programs memory cells addressed by the at least one erase word line to have a threshold voltage distribution range higher than a threshold voltage distribution range of the erase state.

10. The storage device of claim 7, wherein the memory controller issues the program command in an idle state of a normal operation mode in response to determining that the number of erase word lines exceeds the preset value.

11. The storage device of claim 7, wherein the preset value is determined based on a resource used in the nonvolatile memory device.

12. An operating method executed by a storage device that includes a nonvolatile memory device, the method comprising:
   a) identifying a number of word lines in a memory block of the nonvolatile memory device addressing only memory cells existing in an erase state;
   b) programming, in response to determining that the number is less than a predetermined value, a dummy value into each of the memory cells addressed by the word lines in a power-on mode; and
   c) in response to determining that the nonvolatile memory device is not executing a read, program, or erase operation;
      identifying another memory block of the nonvolatile memory de ice having first word lines that address only mentor cells in the erase state and second word lines that address memory cells in a program state differing from the erase state, and
      programming the dummy value into each of the memory cells addressed by the first word lines of the other memory block.

13. The operating method of claim 12, wherein programming the dummy value into the memory cells causes the memory cells to transition to a program state differing from the erase state.

14. The operating method of claim 12, wherein operations (a) and (b) are executed: (1) in response to determining that the storage device has powered on and (2) before the storage device becomes capable of executing a read operation on the nonvolatile memory device while being powered on.

15. The operating method of claim 12, wherein operations (a) and (b) are executed in response to determining that the storage device has transitioned from receiving main power to receiving auxiliary power.

16. The operating method of claim 12, wherein operation (b) applies no more than a single programming voltage to each of the memory cells addressed by the word lines.

17. The operating method of claim 12, wherein operation (c) further comprises programming, in response to determining that the number identified in operation (a) equals or exceeds the predetermined value, the dummy value into each of the memory cells addressed by the word lines.

18. The method of claim 1, wherein storage device is incapable of executing a read operation on the nonvolatile memory device in the power-on mode.

* * * * *